US007564886B2

(12) United States Patent
Nakatsuka (10) Patent No.: US 7,564,886 B2
(45) Date of Patent: Jul. 21, 2009

(54) SEMICONDUCTOR LASER DIODE ARRAY (75) Inventor: Shinichi Nakatsuka, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 224 days.

(21) Appl. No.: 11/174,621

(22) Filed: Jul. 6, 2005

(65) Prior Publication Data
US 2006/0007977 A1    Jan. 12, 2006

(30) Foreign Application Priority Data
Jul. 7, 2004    (JP)    ............................ 2004-200076

(51) Int. Cl.
*H01S 5/00*    (2006.01)
(52) U.S. Cl. ................ 372/50.12; 372/50.122
(58) Field of Classification Search ............... 372/50.12, 372/50.122
See application file for complete search history.

(56) References Cited
U.S. PATENT DOCUMENTS 4,856,015 A * 8/1989 Matsui et al. ............ 372/50.12
6,829,265 B2 * 12/2004 Nakatsuka et al. ............ 372/36
6,995,406 B2 * 2/2006 Tojo et al. ................... 257/103
7,072,374 B2 * 7/2006 Matsumura ............... 372/46.01
2002/0005523 A1 * 1/2002 Taniguchi et al. ............. 257/79
2004/0105471 A1 * 6/2004 Kneissl et al. ................ 372/36
2004/0237299 A1 * 12/2004 Stelzl et al. .................... 29/855

FOREIGN PATENT DOCUMENTS

JP    6-97583    4/1994
JP    7-22708    1/1995

* cited by examiner

*Primary Examiner*—Minsun Harvey
*Assistant Examiner*—Joshua King
(74) *Attorney, Agent, or Firm*—McGinn IP Law Group, PLLC (57) ABSTRACT

In a semiconductor laser diode array, first electrodes of a laser chip are coated with an insulating substance, and contact holes are formed in the insulating substance. The laser chip is assembled by being secured on a submount while facing downward, wherein electrodes and a solder pattern are provided in the submount in a direction crossing resonators.

24 Claims, 12 Drawing Sheets

SEMICONDUCTOR LASER DIODE ARRAY

BACKGROUND OF THE INVENTION

1. Field of the Invention

The invention relates to a semiconductor laser light source used as a light source for a laser printer or an optical disk drive, and particularly relates to a semiconductor laser diode array having plural light-emitting points provided on a single element.

2. Description of the Related Art

Figure 19:
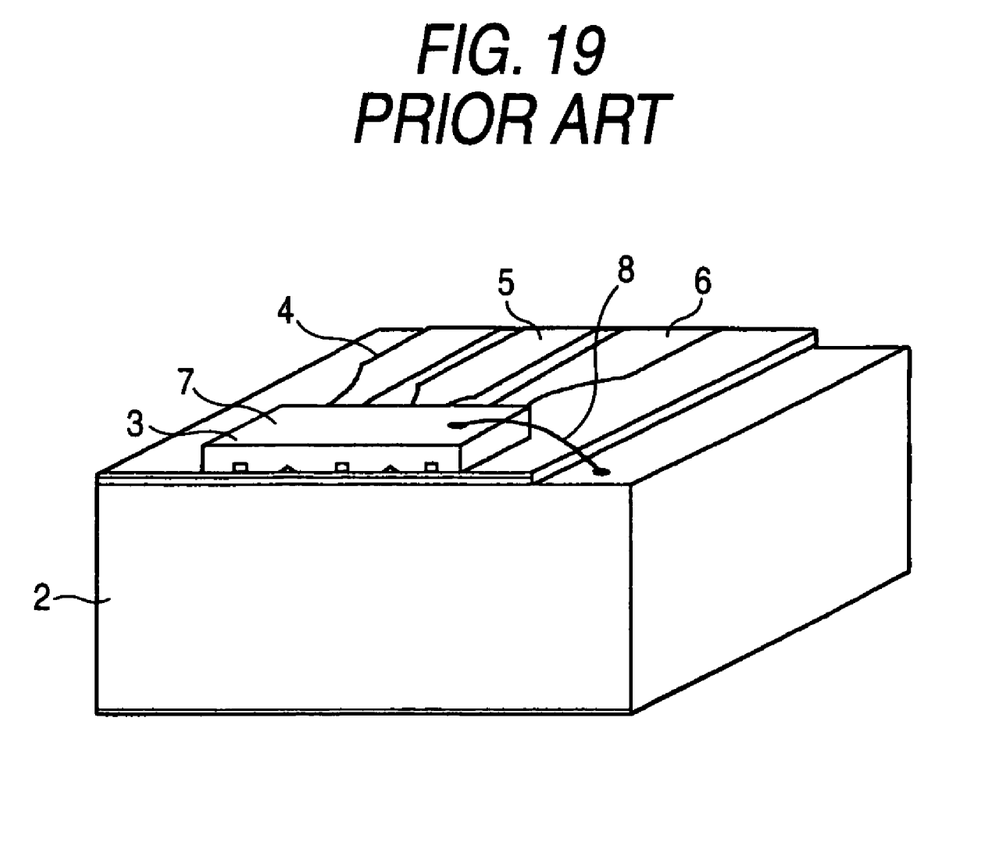
FIG. 19 is a block diagram of a semiconductor laser according to prior art.

In order to perform face down assembly, which is advantageous in heat radiation properties, JP-A-Hei. 7-22708 discloses a semiconductor laser diode array shown in FIG. 19. Specifically, stripe-shaped electrodes corresponding to laser resonators provided in a semiconductor laser chip and stripe-shaped electrodes 4, 5, and 6 provided on a front face of a part, which holds the laser chip and is referred to as a submount, are bonded together by means of a solder layer provided on the electrodes of the submount, to thereby electrically connects the electrodes and physical fixes the laser chip.

Also, JP-A-Hei. 6-97583 discloses a structure including electrodes provided in parallel to laser resonators as with the above case and submount-side electrodes provided correspondingly. Grooves are formed in the laser chip to reduce spreading of solder, which is caused when the laser chip and the submount are bonded.

SUMMARY OF THE INVENTION

In order to bond the submount and the laser chip surely, in JP-A-Hei. 7-22708 and JP-A-Hei. 97583, the solder layer has several micrometers in thickness. During the boding process, the laser chip is pressed against the submount, which is heated at temperatures higher than the melting point of the solder, to bond them. However, at this time, a positional displacement arises in the laser chip, and the fused solder spreads because the laser chip is pressed against the solder. Because of these phenomena, an interval between arrayed lasers at which it is possible to assemble the laser array with superior yield is up to 50 µm or thereabouts.

According to one embodiment of the invention, a semiconductor laser diode array includes a semiconductor chip, and a submount that has a plurality of submount electrodes. The semiconductor chip includes a plurality of stripe-shaped optical resonators, a plurality of first electrodes, an insulation film, and a plurality of second electrodes. The stripe-shaped optical resonators emit light beams when current flows therethrough. The optical resonators are arranged at predetermined intervals on the semiconductor chip. The first electrodes extend in a direction of stripes of the optical resonators. Each first electrode covers each optical resonator. The first electrodes are separated from each other. The insulation film covers the first electrodes. The second electrodes cover the optical resonators through the insulation film, respectively. One second electrode is electrically separated from another second electrode formed above an adjacent optical resonator. A part of the insulation film above the optical resonators defines contact holes through which the first electrodes and the second electrodes are electrically connected with each other. The contact holes are arranged so that at least a part of the contact holes are electrically connected to one of the submount electrodes.

Also, according to one embodiment of the invention, a semiconductor laser diode array includes a semiconductor chip, and a submount having a plurality of submount electrodes. The semiconductor chip includes a plurality of stripe-shaped optical resonators, a plurality of electrodes, an insulation film, and a low-melting glass layer. The stripe-shaped optical resonators emit light beams when current flows therethrough. The optical resonators are arranged at predetermined intervals on the semiconductor chip. The electrodes extend in a direction of stripes of the optical resonators. Each electrode covers each optical resonator. The electrodes are separated from each other. The insulation film covers the electrodes. The low-melting glass layer covers the optical resonators through the insulation film. A part of the low-melting glass layer above the optical resonators defines contact holes through which the electrodes are exposed. At least a part of the contact holes are electrically connected to one of the submount electrodes.

According to the structures described above, it becomes possible to assemble in a facedown manner a multi-element arrayed laser, which has three or more elements at intervals as narrow as 50 µm or less, with superior reproducibility. Also, the structure described above results in that instability of an optical output related to heat discharge characteristic of elements, such as droop characteristic or crosstalk characteristic, can be reduced to several percent or less.

DETAILED DESCRIPTION OF THE PREFERRED EMBODIMENTS

Embodiments of the invention will be described hereinbelow in detail by reference to drawings.

First Embodiment

Figure 1:
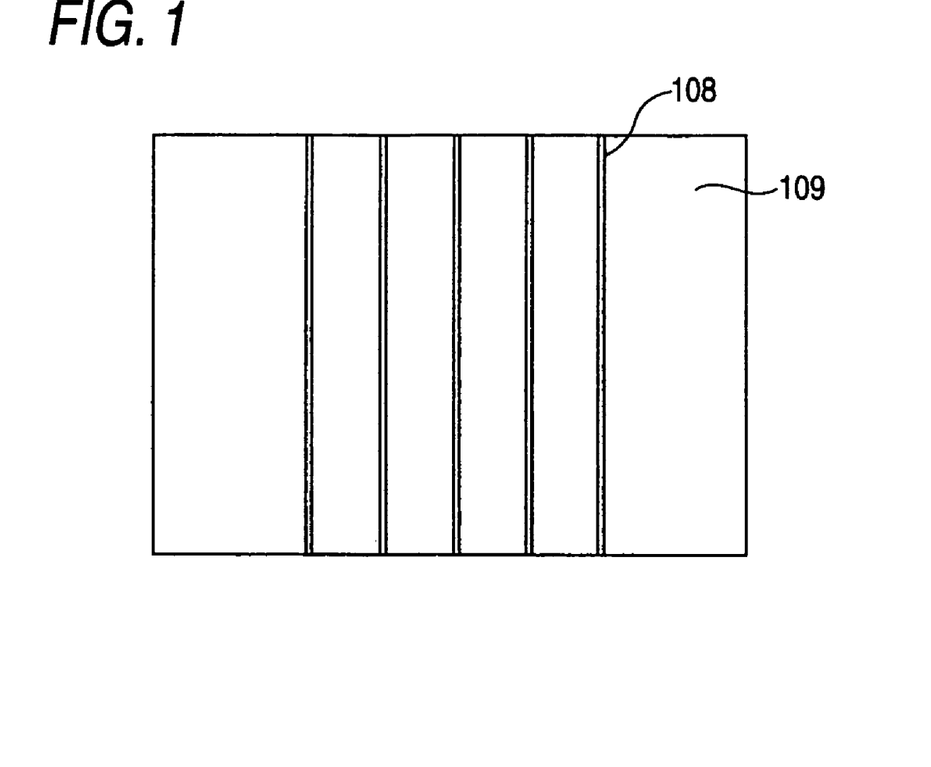
FIG. 1 is a view showing a manufacturing process 1 of a first embodiment.

A first embodiment of the invention will be described by reference to the drawings. First, process for fabricating a semiconductor laser chip of this embodiment will be described. In FIGS. 1 to 6, reference numeral 101 designates an n-type GaAs substrate. The surface orientation of this n-type GaAs substrate 101 is offset from a (100) face toward a (110) orientation by about 10 degrees. An n-type $(Al_{0.7}Ga_{0.3})_{0.5}In_{0.5}P$ cladding layer 102 (Se-doped, $p=1\times10^{18}$ $cm^{-3}$, 1.8 µm in thickness), a multiquantum well active layer 103, a p-type $(Al_{0.7}Ga_{0.3})_{0.5}In_{0.5}P$ cladding layer 104 (Zn-doped, $p=7\times10^{17}$ $cm^{-3}$, 1.6 µm in thickness), and a p-type GaAs cap layer 105 having a thickness of about 0.2 µm (Zn-doped, $p=1\times10^{19}$ $cm^{-3}$, 0.2 µm in thickness) are sequentially formed on the substrate through crystal growth. The multiquantum well active layer 103 is formed of four $Ga_{0.5}In_{0.5}$ P-well layers 106 (each layer having a thickness of 7 nm) and five $(Al_{0.5}Ga_{0.5})_{0.5}In_{0.5}$ P barrier layers 107 (each layer having a thickness of 4 nm), wherein each well layer 106 is sandwiched between the barrier layers 107. The P-type GaAs cap layer 105 and the p-type $(Al_{0.7}Ga_{0.3})_{0.5}In_{0.5}P$ cladding layer 104 are chemically removed to a thickness of 0.3 µm or thereabouts, except for a stripe-shaped region 108, which has a width of 4 µm and will become a waveguide. The remaining cladding layer 104 is covered with a silicon nitride film 109 of a thickness of about 0.1 µm. In the embodiment, five stripe-shaped waveguides 108 are formed at intervals of 20 µm in a (1, −1, 0) orientation in a single semiconductor laser chip. The top silicon nitride film 109 laid on the top p-type GaAs cap layer 105 of the stripe-shaped regions 108 is removed. FIG. 1 is a top view of a single chip in this state.

Figure 2:
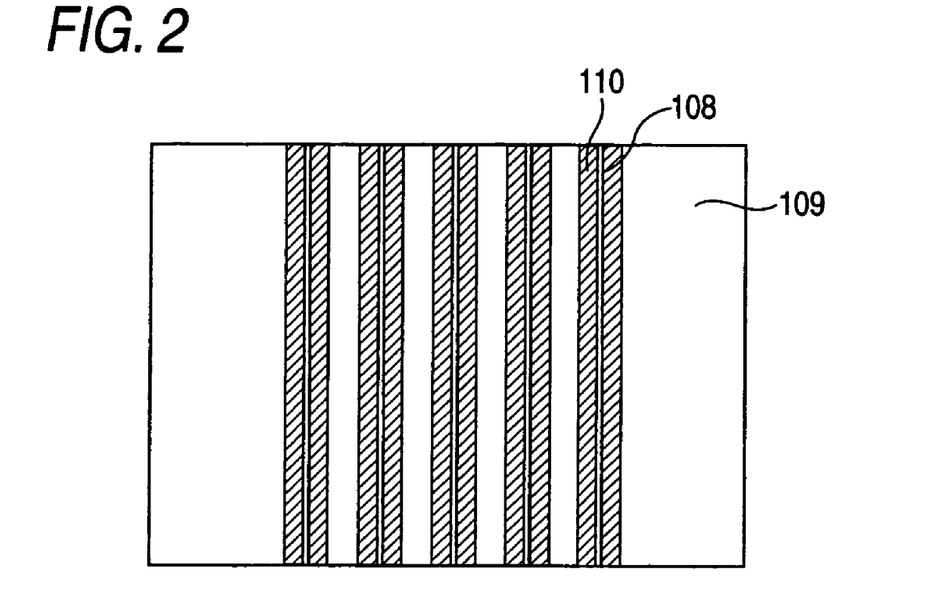
FIG. 2 is a view showing a manufacturing process 2 of the first embodiment.
Figure 3:
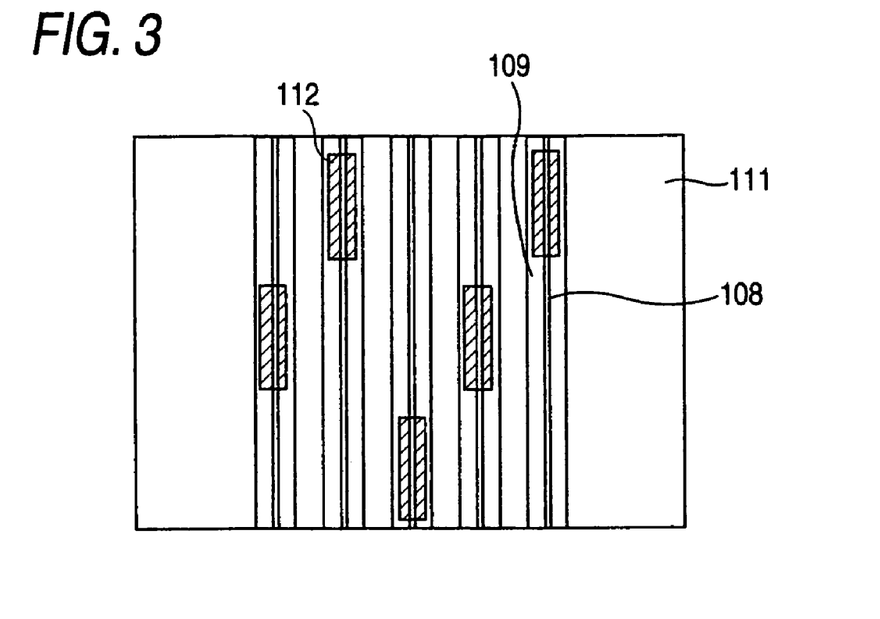
FIG. 3 is a view showing a manufacturing process 3 of the first embodiment.
Figure 4:
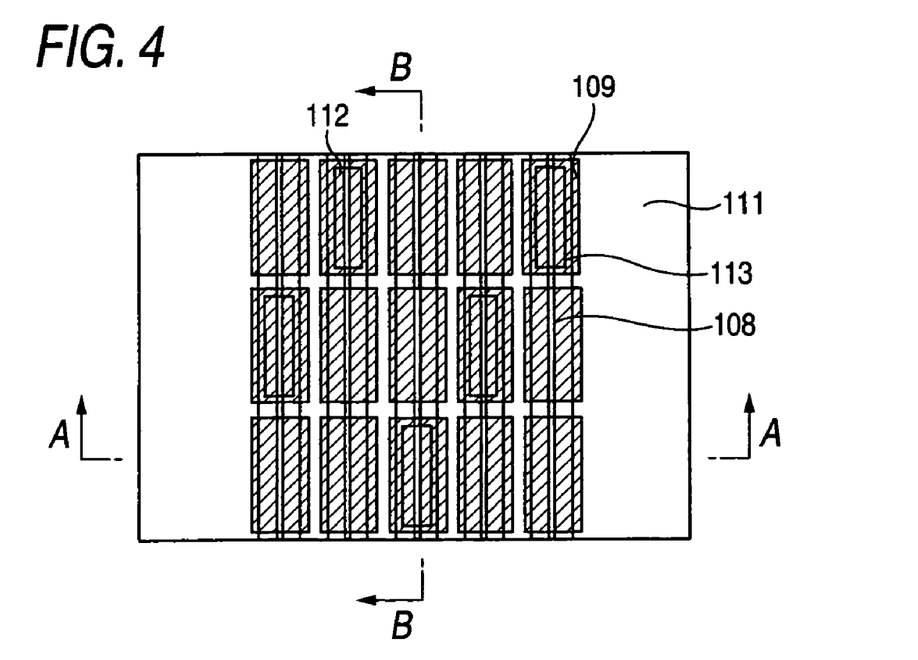
FIG. 4 is a view showing a manufacturing process 4 of the first embodiment.
Figure 5:
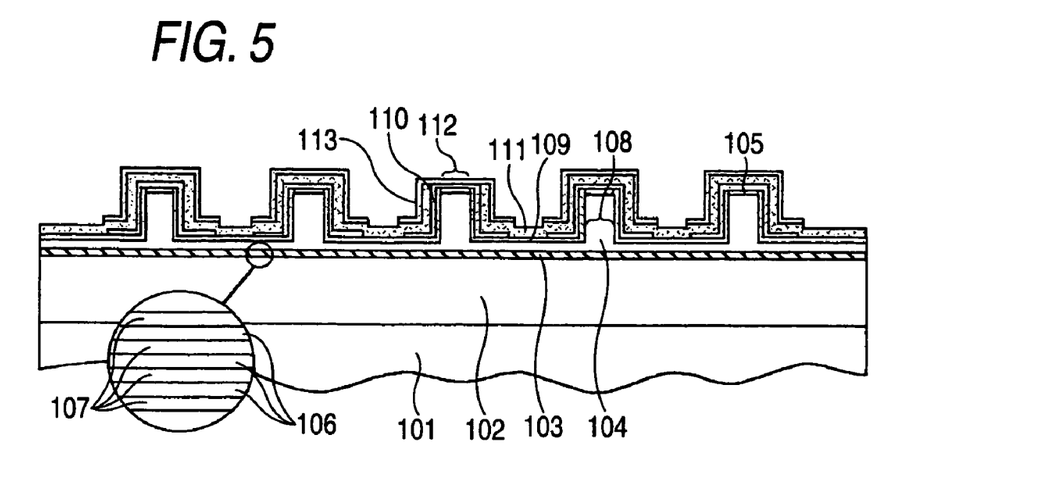
FIG. 5 is a lateral section view of a laser chip of the first embodiment (taken along A-A shown in FIG. 4)
Figure 6:
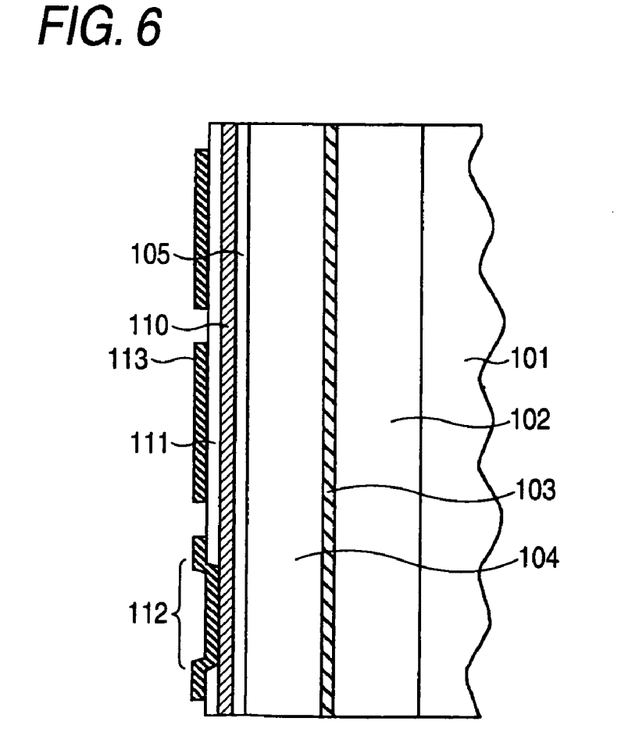
FIG. 6 is a longitudinal section view of a laser chip of the first embodiment (taken along B-B shown in FIG. 4)
Figure 7:
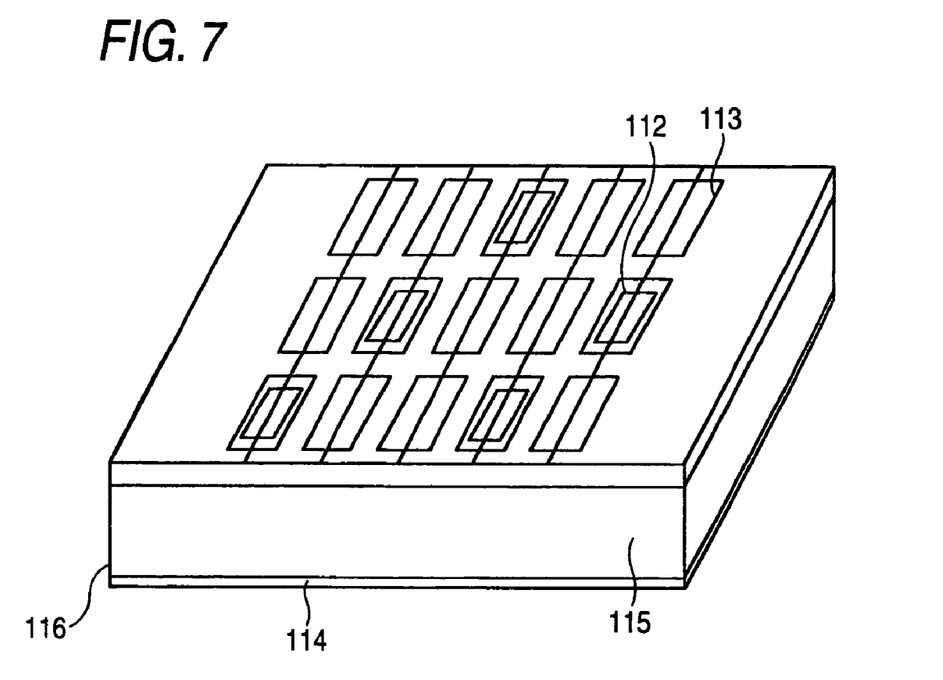
FIG. 7 is a top oblique perspective view of the laser chip of the first embodiment.

As shown in FIG. 2, first electrodes 110 having Au as a main component are formed along the respective stripe-shaped waveguides 108. Then, an aluminum nitride film 111 of a thickness of 0.3 µm is deposited on the wafer shown in FIG. 2. At this time, a two-layer film consisting of a zinc oxide film (0.4 µm) and a silicon oxide film (0.05 µm) has been formed in advance in portions of the first electrodes 110 of the respective stripe-shaped waveguides. After deposition of the aluminum nitride film 111, this two-layer film can be removed together with the aluminum nitride film deposited on the two-layer film, by means of a hydrochloric-acid-based acid. As a result, contact holes 112, through which a part of the respective first electrodes 110 are exposed, are defined in a part of the aluminum nitride film 111. FIG. 3 is a top view of the wafer in this phase. Next, electrodes consisting of titanium, platinum, and gold are evaporated onto the surface of the wafer in such a state as shown in FIG. 3, and second electrodes 113 arranged in a matrix with five rows and three columns as shown in FIG. 4 are formed by means of photolithography and ion milling techniques. FIGS. 5 and 6 are section views of the stripe-shaped waveguides of the semiconductor laser fabricated through the above-described steps taken along a line perpendicular to the stripe shape waveguide and taken along a line parallel to the stripe-shaped waveguides, respectively. After the principal structure of the semiconductor laser has been formed on the GaAs substrate through the above-described processes, the substrate is rubbed to a thickness of about 100 µm and back electrodes 114 are formed. Subsequently, semiconductor laser chips 116 are cleaved to separate the laser chips 116 so that each laser chip 116 has a mirror surface 115 perpendicular to a stripe-shaped resonator. A silicon oxide film is formed on the mirror surfaces 115 for protecting end faces, to thus complete the laser chips. FIG. 7 is a top oblique perspective view of the completed laser chip.

Figure 8:
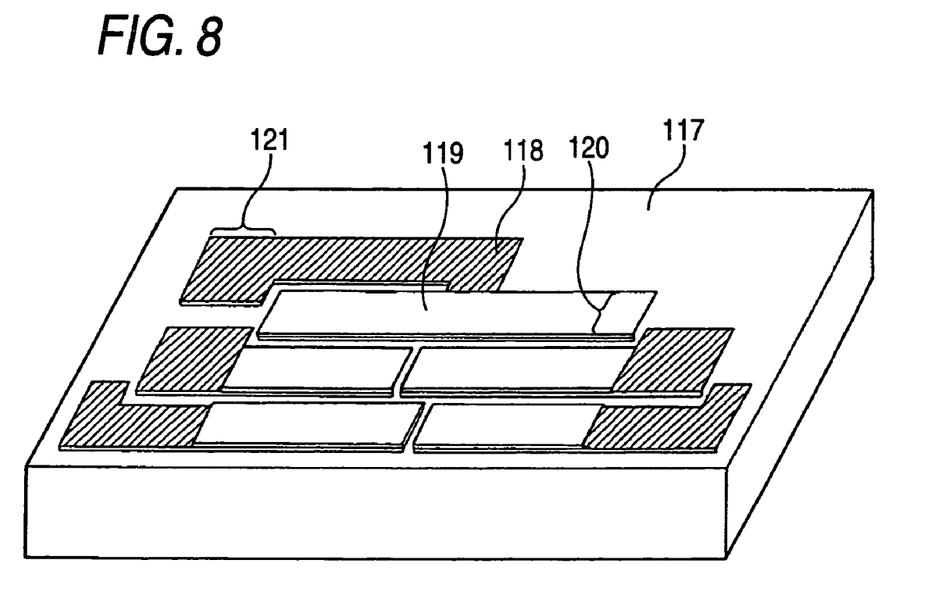
FIG. 8 is a block diagram of a submount.

On the other hand, a submount used for fixing the semiconductor laser chip is formed by laying an electrode layer 118 consisting of titanium, platinum, and gold on an aluminum nitride substrate 117, and further placing a solder layer 119 (an alloy consisting of gold and tin) on a part of the electrode layer 118. The submount has a structure shown in FIG. 8; namely, has five stripe-shaped electrodes 120 and bonding pads 121 used for connecting the electrodes 120 with wires.

Figure 9A:
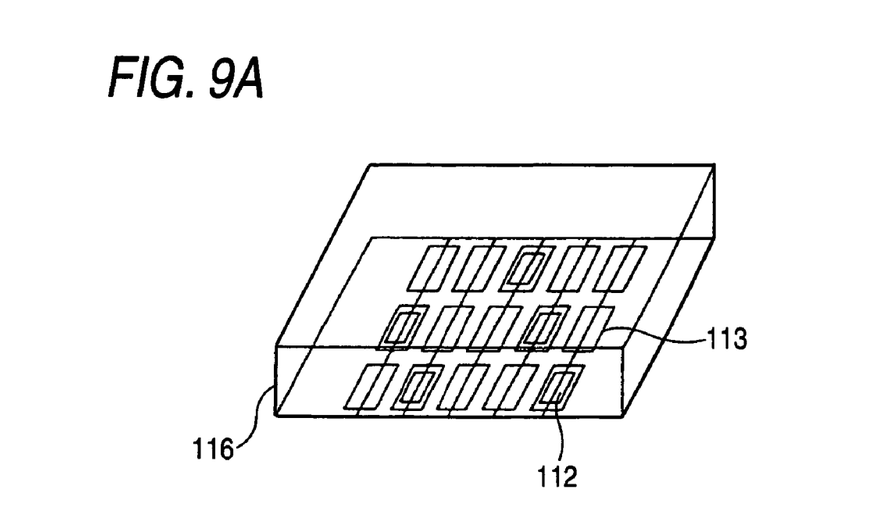
FIGS. 9A and 9B are views showing assembly processes of the first embodiment.
Figure 9B:
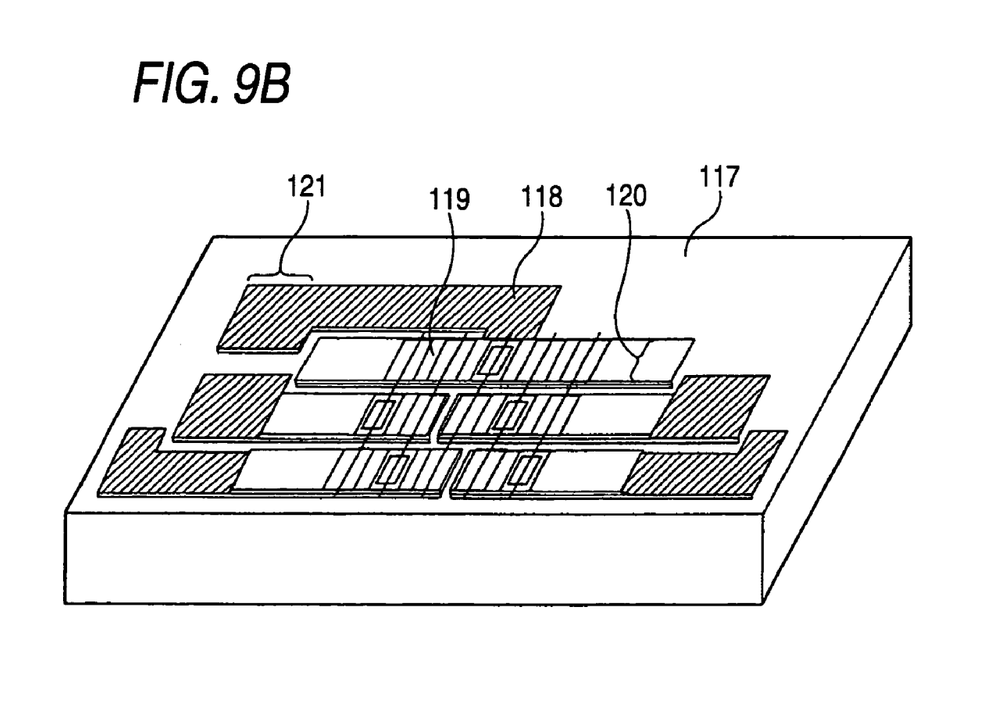

The stripe-shaped electrodes 120 have a width of 80 µm and are spaced at intervals of 20 µm. FIG. 9 shows specifications required to fix the semiconductor laser chip on the submount. The semiconductor laser chips 116 are secured to the submount while surfaces thereof (surfaces having undergone crystal growth) face downward. After determination of a position of the semiconductor laser chip 116, the submount is heated up to the melting point of solder, thereby fixing the semiconductor laser chips onto the submount. A positional relationship among the electrodes 120 of the submount, the solder patterns 119 of the submount, the second electrodes 113 of the semiconductor laser chip 116, and the contact holes 112 of the semiconductor chips is determined so as to have a layout shown in FIGS. 9A and 9B.

Although the aluminum nitride film 111 is not fused with solder, the second electrodes 113 formed on the aluminum nitride 111 are alloyed with solder. Therefore, the semiconductor laser chips 116 are physically fixed at fifteen positions. Moreover, the second electrodes 113 have a function of dissipating the heat having developed in the stripe-shaped waveguides 108 due to current flow to the submount by way of the aluminum nitride film 111 and the silicon nitride film, both of which possess high thermal conductivity. The contact holes 112 are formed at a single position in each first electrode 110. Current flows from the second electrodes 113 to the first electrodes 110 by way of the contact holes 112, to thereby supply current to the overall waveguides 108. Each of five laser resonators of the thus-fabricated semiconductor laser oscillates at a wavelength of about 650 nm, and a threshold current of the laser resonators is about 10 mA. By virtue of the heat-dissipating effect of the second electrodes, the droop characteristic and crosstalk characteristic of the semiconductor lasers show superior values of 3% or less, demonstrating that this laser is suitable for use with a laser printer or an optical disk drive.

Second Embodiment

Figure 10:
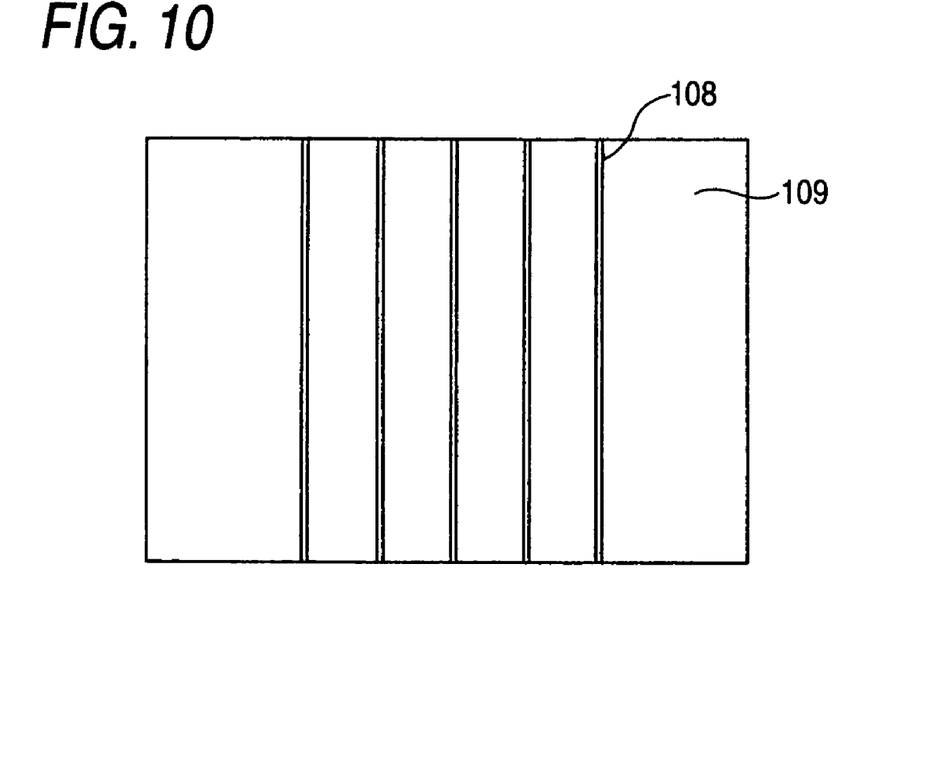
FIG. 10 is a view showing a manufacturing process 1 of a second embodiment.
Figure 13:
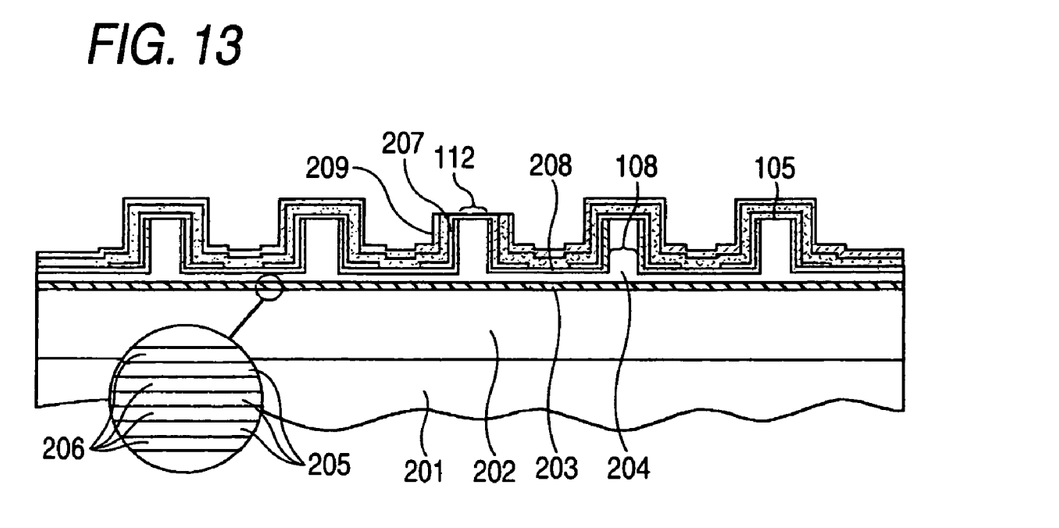
FIG. 13 is a lateral section view of a laser chip of the second embodiment (taken along A-A shown in FIG. 4)

A second embodiment of the invention will be described by reference to the drawings. First, a structure of a semiconductor laser chip according to this embodiment will be described in terms of manufacturing steps. As shown in FIG. 13, in this embodiment, an n-type $Al_{0.7}Ga_{0.3}As$ cladding layer 202 (Se-doped, $p=1\times10^{18}$ $cm^{-3}$, 1.8 µm in thickness), a multiquantum well active layer 203, a p-type $Al_{0.7}Ga_{0.3}As$ cladding layer 204 (Zn-doped, $p=7\times10^{17}$ $cm^{-3}$, 1.6 µm in thickness), and a p-type GaAs cap layer 105 (Zn-doped, $p=1\times10^{19}$ $cm^{-3}$, 0.2 µm in thickness) are sequentially formed on an n-type GaAs substrate 201 through crystal growth. The multiquantum well active layer 203 is formed of four $Ga_{0.5}Al_{0.5}As$ well layers 205 (each layer having a thickness of 7 nm) and five $Al_{0.7}Ga_{0.3}As$ barrier layers 206 (each layer having a thickness of 4 nm), wherein each well layer 205 is sandwiched between the barrier layers 206. The P-type GaAs cap layer 105 and the p-type $Al_{0.7}Ga_{0.3}As$ cladding layer 204 are chemically removed to a thickness of 0.3 μm or thereabouts except for stripe-shaped regions 108, which have 4 μm in width and will become waveguides. The remained cladding layer 204 is covered with a silicon nitride film 207 of a thickness of about 0.1 μm. In the embodiment, the five stripe-shaped waveguides 108 are formed at intervals of 20 μm in a (1, −1, 0) orientation in a single semiconductor laser chip. The silicon oxide film 207 on the top p-type GaAs cap layer 105 of the stripe-shaped regions 108 is removed. FIG. 10 is a top view of a single chip in this state.

Figure 11:
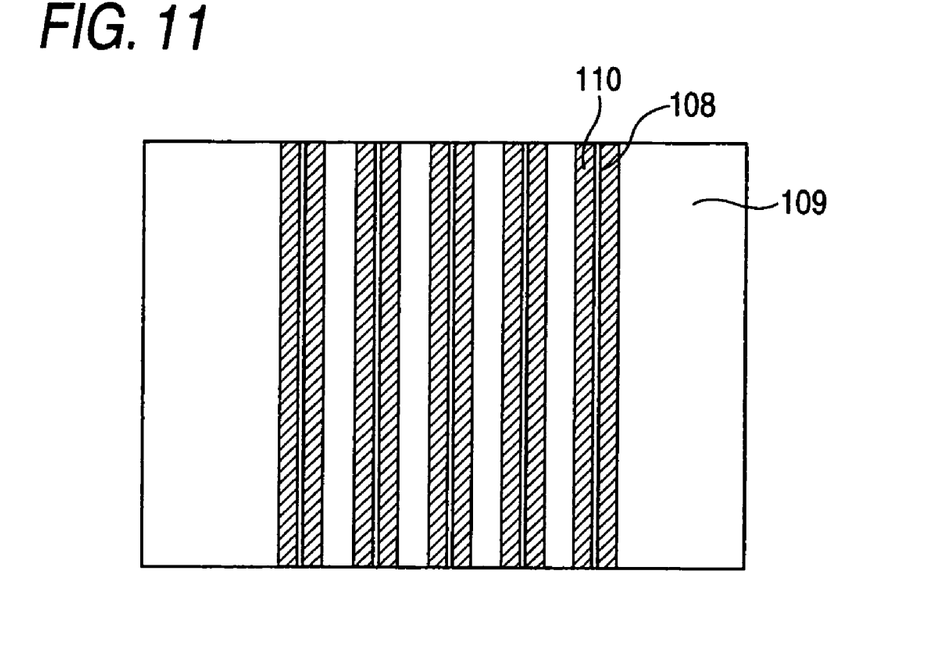
FIG. 11 is a view showing a manufacturing process 2 of the second embodiment.
Figure 12:
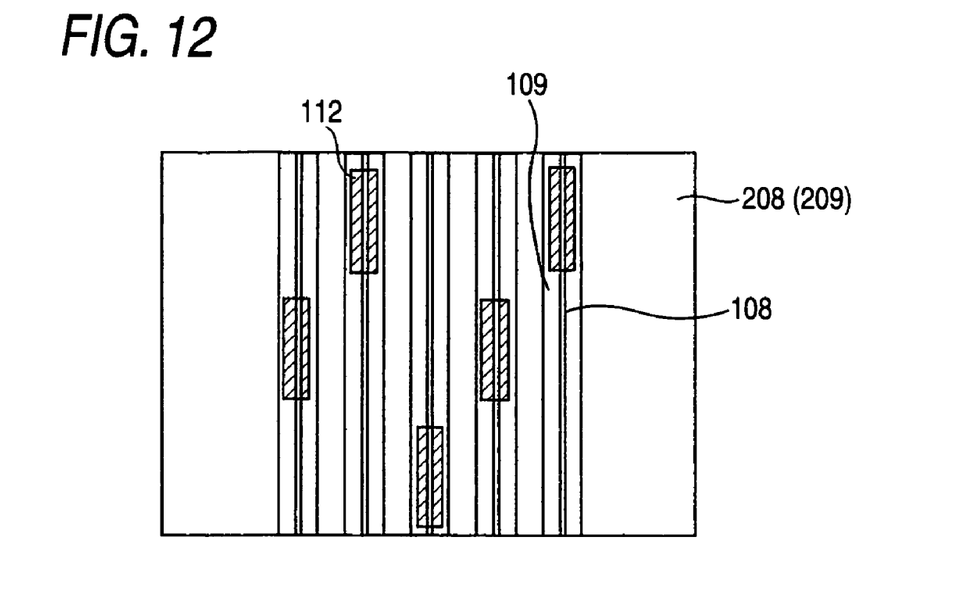
FIG. 12 is a view showing a manufacturing process 3 of the second embodiment.

As shown in FIG. 11, first electrodes 110 having Au as a main component are formed along the respective stripe-shaped waveguides 108. A diamond film 208 of a thickness of 0.3 μm and low-melting glass 209 (boron-oxide/lead-oxide-based) having a thickness of 0.05 μm are deposited on the wafer shown in FIG. 10, by means of the laser abrasion method. The low-melting glass includes $B_2O_3$ and PbO as main proportions, and has a softening temperature in a range of 310° C. to 500° C. At this time, a two-layer film consisting of a zinc oxide film (0.4 μm) and a silicon oxide film (0.05 μm) has been formed in advance at a part of the first electrodes 110 of the respective stripe-shaped waveguides 108. After deposition of the diamond film 208 and the low-melting glass film 209, the two-layer film can be removed together with the diamond film 208 and the low-melting glass film 209 deposited thereon, by means of a hydrochloric-acid-based acid. As a result, contact holes 112, through which a part of the first electrodes 110 are exposed, are defined in a part of the diamond film 208 and low-melting glass film 209. FIG. 12 is a top view of the wafer in this phase. FIG. 13 shows a section profile of the stripe-shaped waveguides 108 of the semiconductor laser fabricated through the above-described processes taken along a line perpendicular to the waveguides 108. After the principal structure of the semiconductor laser has been formed on the GaAs substrate through the above-described processes, the GaAs substrate is rubbed to a thickness of about 100 μm. Then, form back electrodes 114 are formed. Subsequently, the semiconductor laser is cleaved to separate the semiconductor laser chips 116 so that each semiconductor laser chip 116 has a mirror surface 115 perpendicular to the stripe-shaped resonator. A silicon oxide film is formed on the mirror surfaces 115 for protecting end faces, to thus complete the laser chips 116.

Figure 14A:
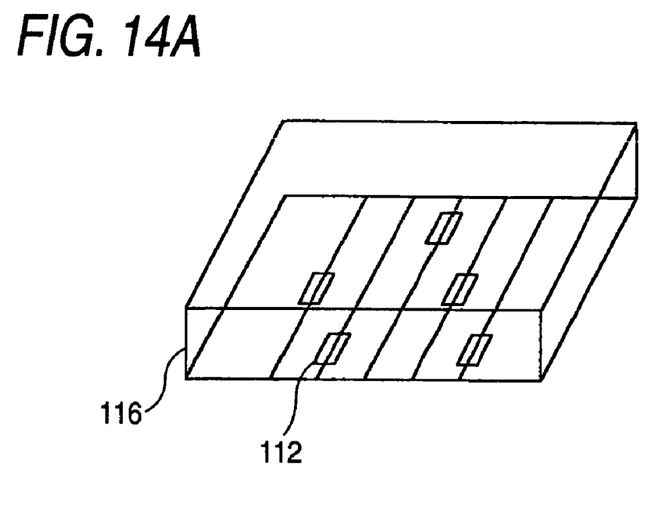
FIGS. 14A and 14B are views showing assembly processes of the second embodiment.
Figure 14B:
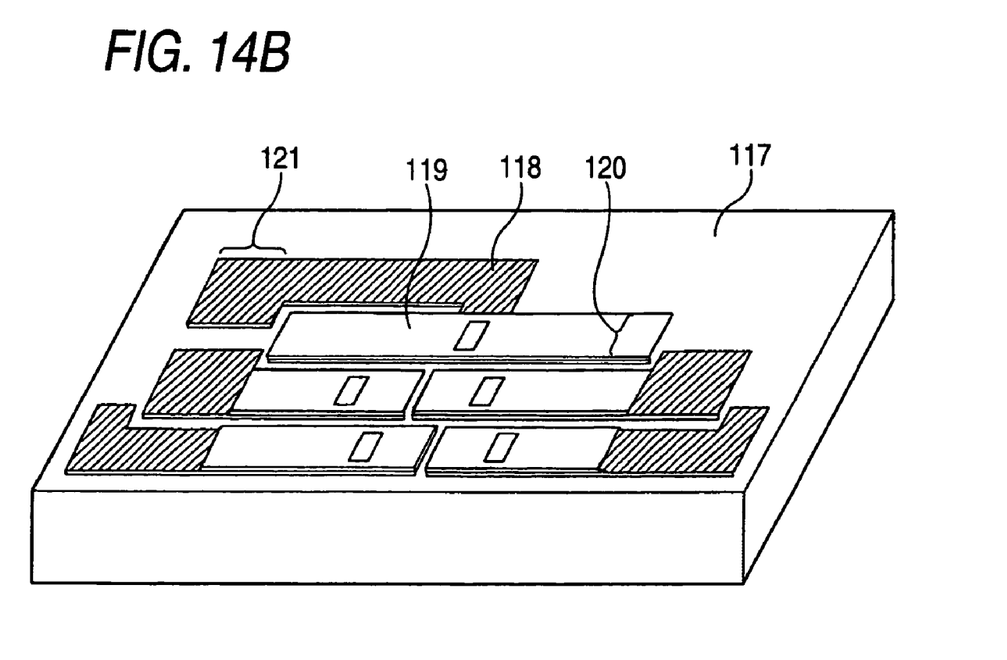

The semiconductor laser chips 116 are fixed to the submount having a structure analogous to that described in the first embodiment. The semiconductor laser chips 116 are secured to the submount while the surfaces thereof (the surfaces having undergone crystal growth) face downward. After determination of a position of the semiconductor laser chip 116, the submount is heated up to the melting point of the low-melting glass 209 (about 420°), whereupon the first electrodes 110 are alloyed and fused with solder in the contact holes 112. In the mean time, in areas where the low-melting glass 209 contacts solder, a superior mechanical and thermal junction is achieved by means of the fused solder and the low-melting glass 209. Accordingly, an element having the same characteristics can be realized by omission of the step for forming the second electrodes 113.

The five laser resonators of the thus-fabricated semiconductor laser oscillate at a wavelength of about 780 nm, and the threshold current of the laser resonators is about 10 mA. By means of the heat-dissipating effect of the low-melting glass fused with the solder layer, the droop and crosstalk characteristics of the semiconductor laser show superior values of 3% or less, demonstrating that this laser is suitable for use with a laser printer and an optical disk drive.

Third Embodiment

Figure 15A:
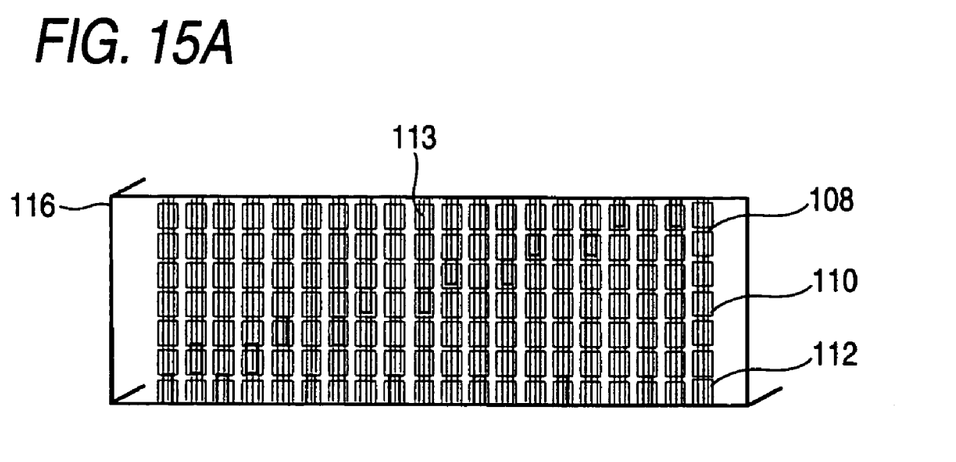
FIGS. 15A and 15B are views showing assembly processes of a third embodiment.
Figure 15B:
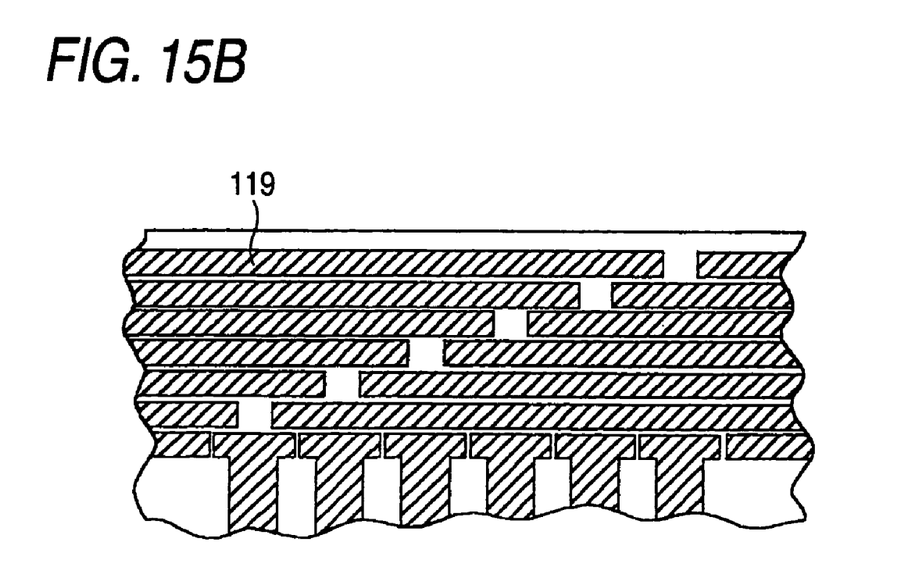

An a third embodiment of the invention, an example will be described in which 20 laser resonators are formed at intervals of 20 μm. The basic structure of this element is identical with that of the first embodiment. Since a plurality of array elements must be integrated, the layout of the second electrodes 113 and the contact holes 112 of the laser chip is set as shown in FIG. 15. On the other hand, the electrodes 118 of the submount are arranged as shown in FIG. 15. As a result, 20 resonators can be integrated within a chip having a width of 600 μm and a length of 300 μm.

Figure 20A:
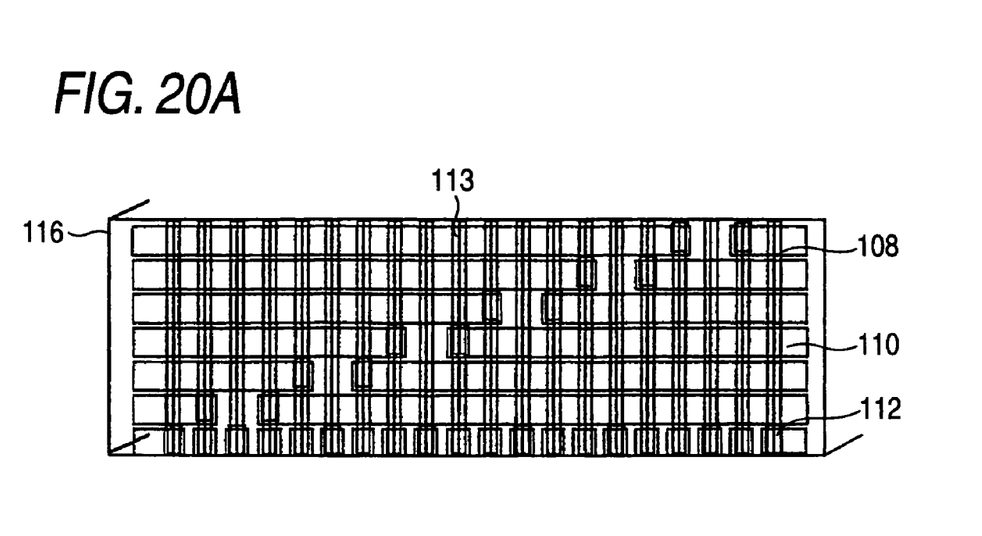
FIGS. 20A and 20B are views showing assembly processes of a modification of the third embodiment.
Figure 20B:
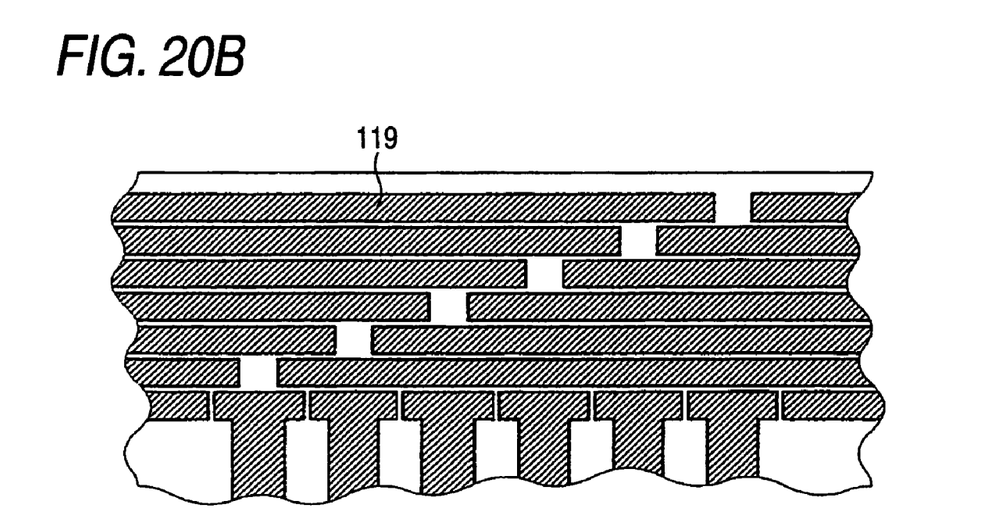

In the third embodiment, the second electrodes 113 are separated from each other and are arranged in a matrix form. The third embodiment may be modified as shown in FIG. 20. Specifically, the second electrodes 113 may extend laterally in the same manner as patterns formed on the submount.

Fourth Embodiment

Figure 16:
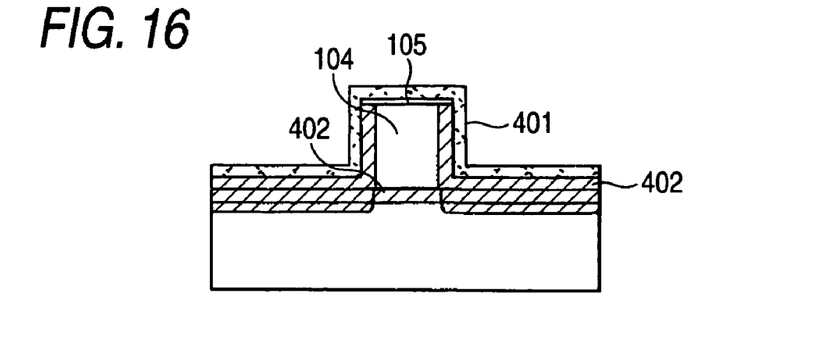
FIG. 16 is a section view of a spread area according to a fourth embodiment.
Figure 17:
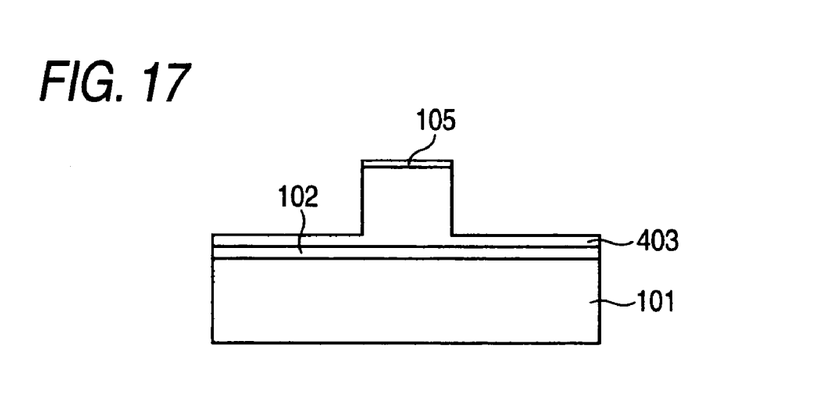
FIG. 17 is a section view of a non-spread area of the fourth embodiment.

For the purpose of reducing operation current of a semiconductor laser, a fourth embodiment of the invention will be described in which a part of semiconductor resonators is formed of transparent waveguides. First, as in the case of the first embodiment, the n-type $(Al_{0.7}Ga_{0.3})_{0.5}In_{0.5}P$ cladding layer 102 (Se-doped, $p=1\times10^{18}$ cm$^{-3}$, 1.8 μm in thickness), the multiquantum well active layer 103, the p-type $(Al_{0.7}Ga_{0.3})_{0.5}In_{0.5}P$ cladding layer 104 (Zn-doped, $p=7\times10^{17}$ cm$^{-3}$, 1.6 μm in thickness), and the p-type GaAs cap layer 105 having a thickness of about 0.2 μm (Zn-doped, $p=1\times10^{19}$ cm$^{-3}$, 0.2 μm in thickness) are sequentially formed on the n-type GaAs substrate 101 through crystal growth. The multiquantum well active layer 103 is formed of the four $Ga_{0.5}In_{0.5}$ P-well layers 106 (each layer having a thickness of 7 nm) and the five $(Al_{0.5}Ga_{0.5})_{0.5}In_{0.5}P$ barrier layers 107 (each layer having a thickness of 4 nm), wherein each well layer 106 is sandwiched between the barrier layers 107. A silicon oxide film is formed for forming stripe-shaped waveguides. Thereafter, zinc is diffused in an area the laser chip about 70 μm to form a transparent waveguide structure in such a way that zinc oxide 401 is used as a source.

FIGS. 16 and 17 show the section structure of a diffused region 402 and that of a non-diffused region 403. In the diffused region 402, the multiquantum well active layer 103 turns into mixed crystal as a result of diffusing zinc, thereby becoming transparent to a laser beam. After removal of zinc oxide, the P-type GaAs cap layer 105 and the p-type $(Al_{0.7}Ga_{0.3})_{0.5}In0.5P$ cladding layer 104 are removed to a thickness of 0.3 μm or thereabouts by means of chemical etching except for the stripe-shaped regions 108, which have 4 μm in width and will become waveguide. The remained cladding layer 104 is covered with the silicon nitride film 109 of a thickness of about 0.1 μm. Then, the silicon nitride film 109 on the top p-type GaAs cap layer 105 in the stripe-shaped region 108 is removed in only the region 402 that has not been subjected to diffusion of zinc.

Figure 18:
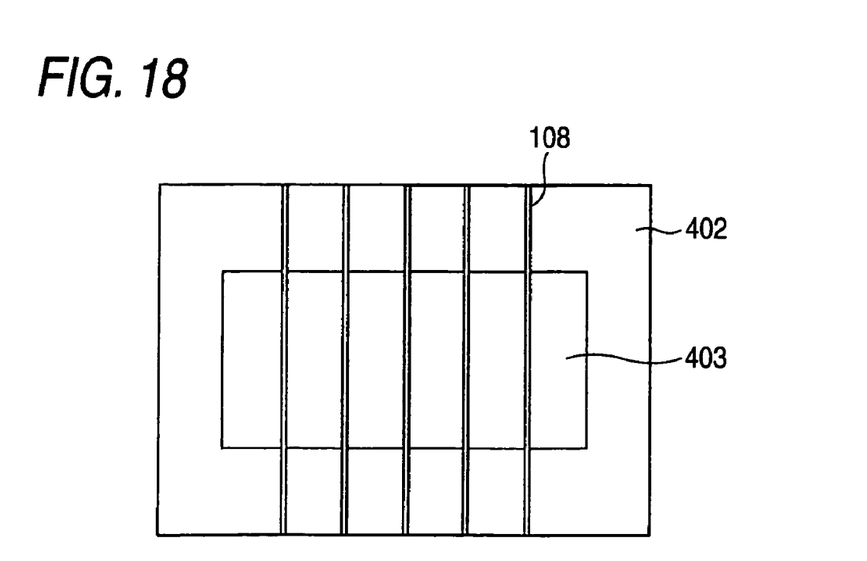
FIG. 18 is a top view of spread and non-spread areas of the fourth embodiment.

FIG. 18 is a top view of one chip in the above-described status. Fabrication processes and processes for assembling a laser chip, which are subsequent to formation of the first electrode, are made identical with those described in the first embodiment. In this embodiment, since the current injection region is limited to about half the chip length, current required to cause the active layer to generate a gain is small. In the meantime, an optical loss in the waveguides that have been made transparent is small. Hence, the semiconductor laser can oscillate at a drive current, which is about half that required to oscillate the semiconductor laser of the first embodiment. Therefore, the amount of heat developing in the overall element is small, and an element having a droop characteristic of 1% or less and a crosstalk characteristic of 1% or less can be implemented. Moreover, according to this embodiment, the number of processes can be decreased in comparison with that required in the first embodiment. Moreover, the interval between the stripes can be made smaller.

What is claimed is:

1. A semiconductor laser diode array comprising:
   a semiconductor chip; and
   a submount that comprises a plurality of submount electrodes,
   wherein the semiconductor chip comprises:
      a plurality of stripe-shaped optical resonators that emit light beams when current flows therethrough, the optical resonators arranged at predetermined intervals on the semiconductor chip;
      a plurality of first electrodes extending in a direction of stripes of the optical resonators, each first electrode covering each optical resonator, the first electrodes being separated from each other;
      an insulation film covering the first electrodes; and
      a plurality of second electrodes covering the optical resonators through the insulation film, respectively, one second electrode being electrically separated from another second electrode and another first electrode except for one particular first electrode, said plurality of second electrodes comprising a plurality of second electrodes formed along each of said optical resonators to form a two-dimensional array of second electrodes;
   wherein a part of the insulation film above the optical resonators defines contact holes through which said particular first and second electrodes are electrically connected with each other,
   wherein the contact holes are arranged so that at least a part of the contact holes are aligned with one of the submount electrodes,
   wherein said contact holes are disposed in a staggered arrangement throughout said two-dimensional array of second electrodes,
   wherein a number of the second electrodes is larger than a number of the contact holes.

2. The semiconductor laser diode array according to claim 1, wherein the insulation film comprises at least one selected from a group consisting of $SiO_2$, SiN, AlN, and diamond.

3. The semiconductor laser diode array according to claim 1, wherein the submount electrodes are formed of a multilayer film including a metal film and a solder layer.

4. The semiconductor laser diode array according to claim 1, wherein at least a part of each optical resonator includes a waveguide, which is substantially transparent to the light beam emitted from each optical resonator.

5. A semiconductor laser diode array comprising: a semiconductor chip; and a submount that comprises a plurality of submount electrodes, wherein the semiconductor chip comprises: a plurality of stripe-shaped optical resonators that emit light beams when current flows therethrough, the optical resonators arranged at predetermined intervals on the semiconductor chip; a plurality of electrodes extending in a direction of stripes of the optical resonators, each electrode covering each optical resonator, the electrodes being separated from each other; an insulation film covering the electrodes; and a low-melting glass layer covering the optical resonators through the insulation film; wherein a part of the low-melting glass layer above the optical resonators defines contact holes through which the electrodes are exposed; wherein at least a part of the contact holes are aligned with one of the submount electrodes; and wherein said contact holes are disposed in a staggered arrangement; and wherein said low-melting glass layer and solder connecting said plurality of submount electrodes with said plurality of electrodes extending in a direction of stripes of the optical resonators are fused.

6. The semiconductor laser diode array according to claim 5, wherein the insulation film comprises at least one selected from a group consisting of SiN, AlN, and diamond.

7. The semiconductor laser diode array according to claim 5, wherein the submount electrodes are formed of a multilayer film including a metal film and a solder layer.

8. The semiconductor laser diode array according to claim 5, wherein at least a part of each optical resonator includes a waveguide, which is substantially transparent to the light beam emitted from each optical resonator.

9. The semiconductor laser diode array according to claim 1, wherein said plurality of stripe-shaped optical resonators are arranged at intervals of 50 µm or less.

10. The semiconductor laser diode array according to claim 1, wherein said plurality of stripe-shaped optical resonators are arranged at intervals of approximately 20 µm.

11. The semiconductor laser diode array according to claim 1, further comprising a SiN film disposed between said plurality of stripe-shaped optical resonators and said first electrodes.

12. The semiconductor laser diode array according to claim 1, wherein said plurality of submount electrodes are arranged at intervals of approximately 20 µm.

13. The semiconductor laser diode array according to claim 1, wherein said plurality of second electrodes are alloyed with a solder.

14. The semiconductor laser diode array according to claim 1, wherein said electrodes consist of titanium, platinum and gold.

15. The semiconductor laser diode array according to claim 1, wherein said plurality of stripe-shaped optical resonators and said plurality of first electrodes are formed in a matrix.

16. The semiconductor laser diode array according to claim 5, further comprising a diamond film disposed between said plurality of stripe-shaped optical resonators and said plurality of electrodes.

17. The semiconductor laser diode array according to claim 5, wherein said low-melting glass layer comprises $B_2O_3$ and PbO.

18. The semiconductor laser diode array according to claim 5, wherein said low-melting glass layer has a softening temperature in a range of 310° C. to 500° C.

19. A method of forming a semiconductor laser diode array comprising:
   forming a semiconductor chip;
   forming a submount that comprises a plurality of submount electrodes,
   wherein the semiconductor chip comprises:
      a plurality of stripe-shaped optical resonators that emit light beams when current flows therethrough, the optical resonators arranged at predetermined intervals on the semiconductor chip;
      a plurality of first electrodes extending in a direction of stripes of the optical resonators, each first electrode covering each optical resonator, the first electrodes being separated from each other;
      an insulation film covering the first electrodes; and a plurality of second electrodes covering the optical resonators through the insulation film, respectively, one second electrode being electrically separated from another second electrode and another first electrode except for one particular first electrode, said plurality of electrodes comprising a plurality of electrodes formed along each of said optical resonators to form a two-dimensional array of electrodes; and forming contact holes through a part of the insulation film above the optical resonators which said particular first and second electrodes are electrically connected with each other, said contact holes being arranged so that at least a part of the contact holes are aligned with one of the submount electrodes, wherein said contact holes are disposed in a staggered arrangement throughout said two-dimensional array of second electrodes, and wherein a number of the second electrodes is larger than a number of the contact holes.

20. The semiconductor laser diode array according to claim 1, wherein said insulation film covers substantially an entirety of said first electrodes.

21. The semiconductor laser diode array according to claim 1, wherein said first electrodes cover a top surface and sidewalls of said stripe-shaped optical resonators.

22. The semiconductor laser diode array according to claim 1, wherein said second electrodes cover a top surface and sidewalls of said first electrodes.

23. The semiconductor laser diode array according to claim 1, wherein each second electrode is soldered to a corresponding one of the submount electrodes.

24. The semiconductor laser diode array according to claim 1, wherein at least one of the second electrodes is isolated from one of the first electrodes disposed thereunder and is soldered with a corresponding one of the submount electrodes.

* * * * *